(12) United States Patent
Choi et al.

(10) Patent No.: US 11,043,538 B2
(45) Date of Patent: Jun. 22, 2021

(54) ORGANIC IMAGE SENSORS

(71) Applicant: Samsung Electronics Co., Ltd., Suwon-si (KR)

(72) Inventors: Min-jun Choi, Hwaseong-si (KR); Kwan-sik Kim, Seoul (KR); Beom-suk Lee, Yongin-si (KR); Hae-min Lim, Seoul (KR); Man-geun Cho, Suwon-si (KR)

(73) Assignee: Samsung Electronics Co., Ltd.

( * ) Notice: Subject to any disclaimer, the term of this patent is extended or adjusted under 35 U.S.C. 154(b) by 154 days.

(21) Appl. No.: 16/226,016

(22) Filed: Dec. 19, 2018

(65) Prior Publication Data

US 2019/0371860 A1    Dec. 5, 2019

(30) Foreign Application Priority Data

Jun. 4, 2018    (KR) .................. 10-2018-0064483

(51) Int. Cl.
*H01L 27/30* (2006.01)
*H04N 5/378* (2011.01)
*H01L 51/44* (2006.01)
*H01L 27/146* (2006.01)

(52) U.S. Cl.
CPC .......... *H01L 27/307* (2013.01); *H04N 5/378* (2013.01); *H01L 27/14612* (2013.01); *H01L 27/14621* (2013.01); *H01L 27/14645* (2013.01); *H01L 51/44* (2013.01)

(58) Field of Classification Search
CPC ............ H01L 27/307; H01L 27/14645; H01L 51/4213
See application file for complete search history.

(56) References Cited

U.S. PATENT DOCUMENTS

| 9,024,362 | B2 | 5/2015 | Kim et al. | |
| 9,559,148 | B2 | 1/2017 | Nakatani | |
| 9,780,130 | B2 | 10/2017 | Suh et al. | |
| 2005/0151228 | A1 | 7/2005 | Tanida et al. | |
| 2006/0125944 | A1* | 6/2006 | Inuiya | H01L 27/14645 348/311 |
| 2011/0032376 | A1* | 2/2011 | Takizawa | H01L 27/1463 348/222.1 |
| 2013/0033628 | A1* | 2/2013 | Yamaguchi | H04N 5/3741 348/294 |

(Continued)

FOREIGN PATENT DOCUMENTS

| JP | 2005167093 | 6/2005 |
| JP | 2008053252 | 3/2008 |

(Continued)

*Primary Examiner* — Tuan A Hoang
(74) *Attorney, Agent, or Firm* — Myers Bigel, P.A.

(57) ABSTRACT

Organic image sensors are provided. An organic image sensor includes a pixel electrode including a plurality of first electrodes spaced apart from each other. The organic image sensor includes an insulating region including a protruding portion that protrudes beyond surfaces of the plurality of first electrodes. The organic image sensor includes an organic photoelectric conversion layer on the pixel electrode and the protruding portion of the insulating region. Moreover, the organic image sensor includes a second electrode opposite the pixel electrode and on the organic photoelectric conversion layer.

19 Claims, 14 Drawing Sheets

(56) References Cited

U.S. PATENT DOCUMENTS

| | | | |
|---|---|---|---|
| 2014/0375826 A1* | 12/2014 | Lee | H01L 51/442 |
| | | | 348/207.1 |
| 2015/0054105 A1* | 2/2015 | Yamaguchi | H01L 27/14636 |
| | | | 257/432 |
| 2016/0013247 A1 | 1/2016 | Nakatani | |
| 2016/0065916 A1* | 3/2016 | Ishioka | H04N 5/2254 |
| | | | 359/891 |
| 2017/0331043 A1 | 11/2017 | Kuhn et al. | |
| 2017/0343556 A1 | 11/2017 | Mistry et al. | |
| 2017/0365784 A1 | 12/2017 | Dartnell et al. | |
| 2018/0013961 A1 | 1/2018 | Lee et al. | |

FOREIGN PATENT DOCUMENTS

| JP | 2011258729 | 12/2011 |
|---|---|---|
| JP | 5873847 | 3/2016 |
| JP | 6231435 | 11/2017 |

* cited by examiner

ORGANIC IMAGE SENSORS

CROSS-REFERENCE TO RELATED APPLICATION

This application claims the benefit of Korean Patent Application No. 10-2018-0064483, filed on Jun. 4, 2018, in the Korean Intellectual Property Office, the disclosure of which is hereby incorporated herein in its entirety by reference.

BACKGROUND

The present disclosure relates to image sensors. The number of pixels in image sensors (or solid-state imaging devices) has increased in order to obtain high-resolution images. In the image sensors, when the size of the pixel is reduced, a light receiving area of a photoelectric device may be reduced and thus optical sensitivity may be lowered.

Accordingly, a stacked organic image sensor, in which an organic photoelectric device is stacked on a semiconductor photoelectric device formed over a semiconductor substrate, has been proposed as an image sensor. The organic photoelectric device in the organic image sensor may include an organic photoelectric conversion layer.

SUMMARY

The inventive concepts provide an organic image sensor including an organic photoelectric device having improved adhesion between an organic photoelectric conversion layer and an insulating layer and/or an electrode. The improved adhesion may improve the manufacturing yield of the organic image sensor and/or the reliability of the organic image sensor.

According to some embodiments of the inventive concepts, an organic image sensor may include a pixel electrode that includes a plurality of first electrodes spaced apart from each other. The organic image sensor may include an insulating region that includes a protruding portion that protrudes beyond surfaces of the plurality of first electrodes. The organic image sensor may include an organic photoelectric conversion layer on the pixel electrode and the protruding portion of the insulating region. Moreover, the organic image sensor may include a second electrode opposite the pixel electrode and on the organic photoelectric conversion layer.

According to some embodiments of the inventive concepts, an organic image sensor may include a semiconductor substrate. The organic image sensor may include a pixel circuit on the semiconductor substrate. The organic image sensor may include an interlayer insulating layer on the pixel circuit. The organic image sensor may include an organic photoelectric device. The organic photoelectric device may include a pixel electrode that includes a plurality of first electrodes spaced apart from each other and insulated from each other by an isolation insulating layer on the interlayer insulating layer. The organic photoelectric device may include a ridge portion protruding from a surface of the isolation insulating layer that is between the plurality of first electrodes. The organic photoelectric device may include an organic photoelectric conversion layer on the pixel electrode and the ridge portion. The organic photoelectric device may include an opposite electrode opposite to the pixel electrode and including a second electrode on the organic photoelectric conversion layer. Moreover, the organic image sensor may include a via electrode in the interlayer insulating layer and electrically connecting the pixel circuit to the pixel electrode.

According to some embodiments of the inventive concepts, an organic image sensor may include a semiconductor substrate. The organic image sensor may include a semiconductor photoelectric device on the semiconductor substrate. The organic image sensor may include a first pixel circuit electrically connected to the semiconductor photoelectric device on the semiconductor substrate. The organic image sensor may include an organic photoelectric device stacked on the semiconductor photoelectric device and including an organic photoelectric conversion layer. Moreover, the organic image sensor may include a second pixel circuit electrically connected to the organic photoelectric device on the semiconductor substrate. The organic photoelectric device may include a pixel electrode that includes a plurality of first electrodes. The organic photoelectric device may include an insulating region that includes a first portion that is between the plurality of first electrodes and a protruding second portion that protrudes upwardly beyond respective upper surfaces of the plurality of first electrodes. The organic photoelectric conversion layer may be on the pixel electrode and the protruding second portion of the insulating region. The first portion of the insulating region may include an isolation insulating layer that isolates the plurality of first electrodes from each other. Also, the organic photoelectric device may include a second electrode opposite the pixel electrode and on the organic photoelectric conversion layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
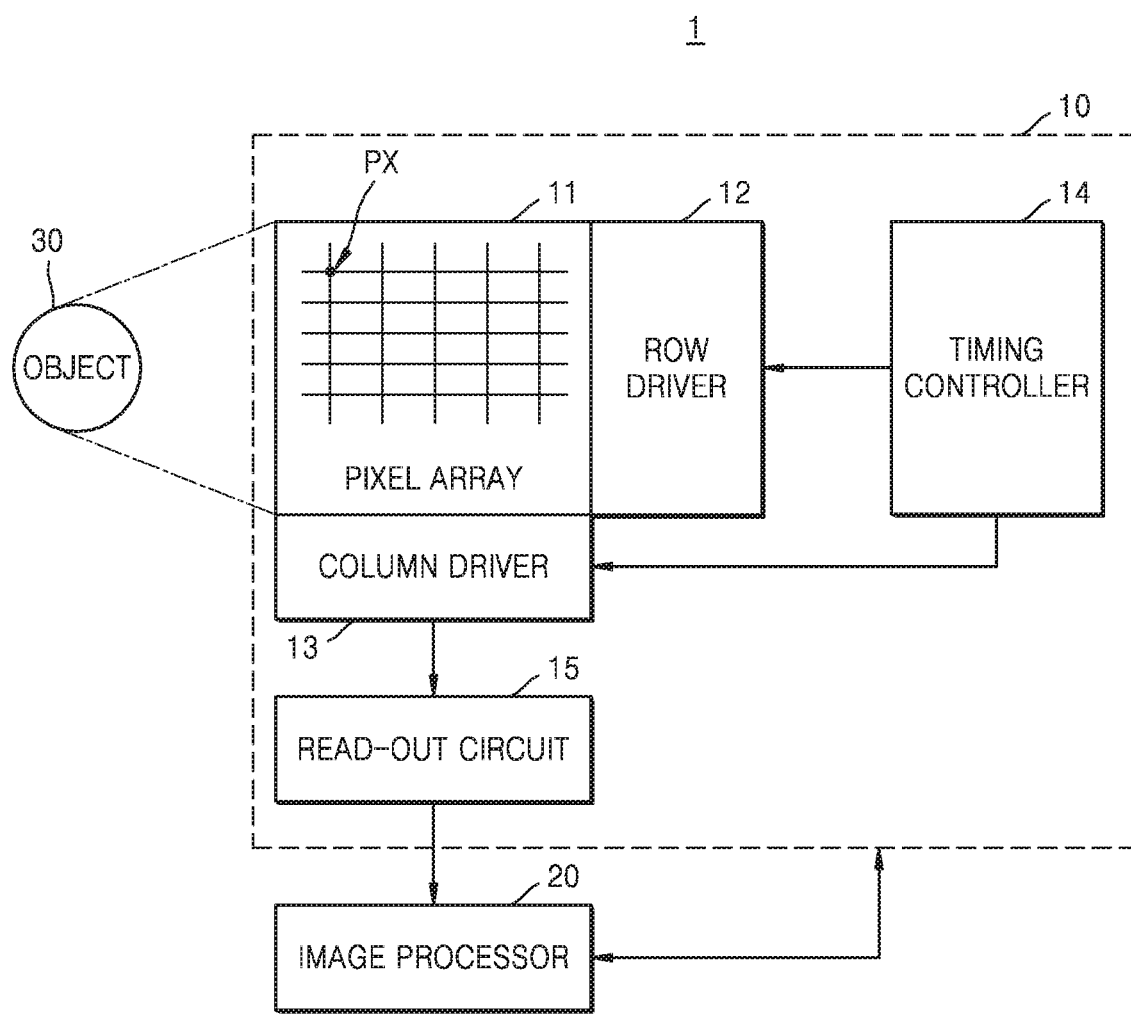
FIG. 1 is a block diagram of an image processing apparatus including an organic image sensor according to some embodiments of the inventive concepts.

FIG. 1 is a block diagram of an image processing apparatus 1 including an organic image sensor according to some embodiments of the inventive concepts.

Referring to FIG. 1, the image processing apparatus 1 may include an organic image sensor 10 and an image processor 20. The organic image sensor 10 may include a pixel array 11, a row driver 12, a column driver 13, a timing controller 14, and a read-out circuit 15.

The organic image sensor 10 may operate according to a control command of the image processor 20. The organic image sensor 10 may convert light reflected or transmitted from an object 30 into an electrical signal and output the electrical signal to the image processor 20. The pixel array 11 in the organic image sensor 10 may include a plurality of pixels PX. Each of the pixels PX may include a photoelectric device that receives light to generate charges.

In some embodiments, the photoelectric device may include an organic photoelectric device. In some embodiments, the photoelectric device may further include a semiconductor photoelectric device. The organic image sensor 10 may be a stacked image sensor in which an organic photoelectric device is stacked on a semiconductor photoelectric device formed in a semiconductor substrate or a plurality of organic photoelectric devices are stacked on a semiconductor substrate.

The organic photoelectric device may include a pixel electrode, an organic photoelectric conversion layer, and an opposite electrode. The organic photoelectric conversion layer may be an organic photodiode. The semiconductor photoelectric device may include a semiconductor photoelectric conversion layer. The semiconductor photoelectric conversion layer may be a semiconductor photodiode, such as a silicon photodiode. The organic photoelectric device and the semiconductor photoelectric device will be described in more detail later herein.

In some embodiments, each of the pixels PX may include two or more photoelectric devices, and two or more photoelectric devices in one pixel PX may receive light of different colors to generate charges. Each of the pixels PX may include a pixel circuit for generating an electrical signal from charges generated by the photoelectric device.

In some embodiments, the pixel circuit may include a transfer transistor, a drive transistor, a selection transistor, a reset transistor, and the like. When one pixel PX has two or more photoelectric devices, each pixel PX may include a pixel circuit for processing charges generated by each of the two or more photoelectric devices.

The row driver 12 may drive the pixel array 11 in row units. For example, the row driver 12 may generate a transfer control signal for controlling the transfer transistor of each pixel PX, a reset control signal for controlling the reset transistor of each pixel PX, a selection control signal for controlling the selection transistor of each pixel PX, and the like.

The column driver 13 may include a correlated double sampler (CDS), an analog-to-digital converter (ADC), and the like. The CDS may receive signals from pixels PX in a row selected by a row selection signal supplied by the row driver 12 and perform correlated double sampling. The analog-to-digital converter may convert the output of the CDS into a digital signal and deliver the digital signal to the read-out circuit 15.

The read-out circuit 15 may include a latch or buffer circuit capable of temporarily storing a digital signal, an amplification circuit, and the like. The read-out circuit 15 may temporarily store or amplify a digital signal received from the column driver 13 to generate image data. The operation timings of the row driver 12, the column driver 13, and the read-out circuit 15 may be determined by the timing controller 14.

The timing controller 14 may operate in response to a control command transmitted from the image processor 20. The image processor 20 may process image data transferred by the read-out circuit 15 and may output the processed image data to a display device or the like, or store the processed image data in a storage device such as a memory.

Figure 2:
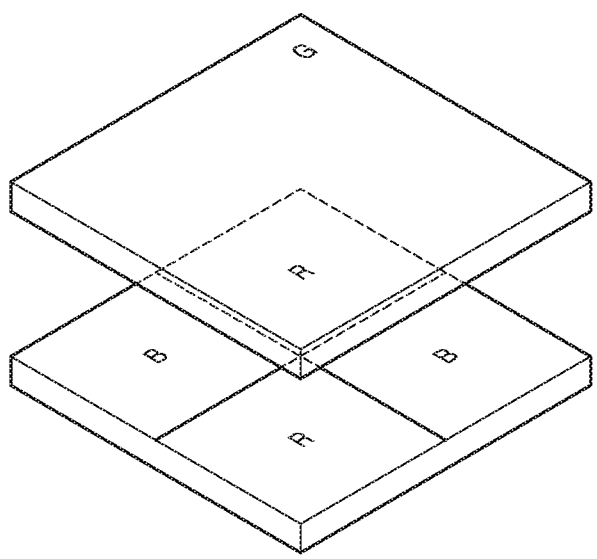
FIG. 2 is a plan view of a pixel of an organic image sensor according to some embodiments of the inventive concepts.
Figure 3:
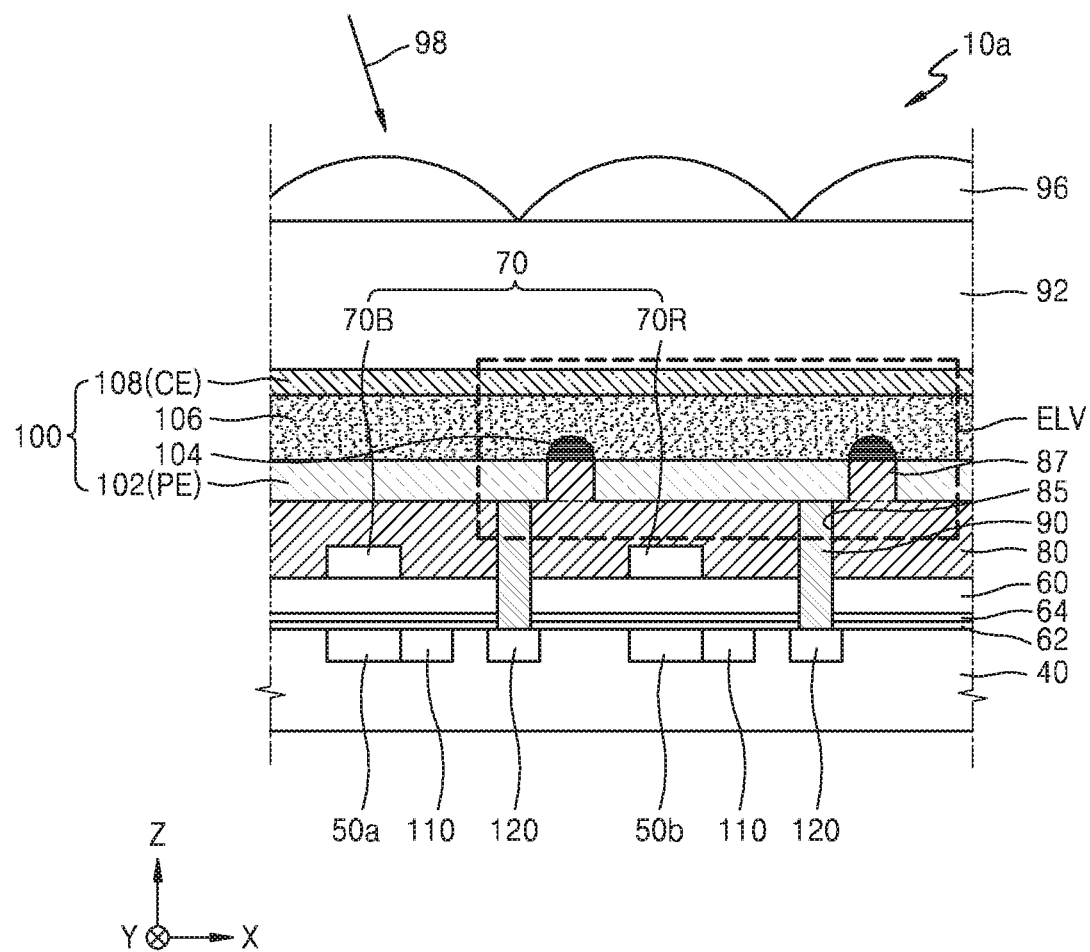
FIG. 3 is a cross-sectional view of a portion of an organic image sensor according to some embodiments of the inventive concepts.

FIG. 2 is a plan view of a pixel of an organic image sensor 10a according to some embodiments of the inventive concepts, and FIG. 3 is a cross-sectional view of a portion of the organic image sensor 10a according to some embodiments of the inventive concepts.

Referring to FIGS. 2 and 3, the organic image sensor 10a may be an organic CMOS image sensor. A pixel PX of the organic image sensor 10a may have a form in which a green pixel G is stacked on a blue pixel B and a red pixel R, as shown in FIG. 2. The blue pixel B selectively absorbs light (blue light) in a blue wavelength range, the red pixel R selectively absorbs light (red light) in a red wavelength range, and the green pixel G selectively absorbs light (green light) in a green wavelength range.

The organic image sensor 10a may include semiconductor photoelectric devices 50a and 50b, an organic photoelectric device 100, and first and second pixel circuits 110 and 120, as shown in FIG. 3. The organic image sensor 10a may be a stacked image sensor in which the organic photoelectric device 100 is stacked on the semiconductor photoelectric devices 50a and 50b in the Z direction perpendicular to a semiconductor substrate 40.

In other words, the organic image sensor 10a is a stacked image sensor in which the organic photoelectric device 100 is stacked on the semiconductor photoelectric devices 50a and 50b on the semiconductor substrate 40 in the Z direction perpendicular to the X-Y plane. The semiconductor photoelectric devices 50a and 50b and the first and second pixel circuits 110 and 120 may be formed or implemented on the semiconductor substrate 40. The semiconductor substrate 40 may be a silicon substrate.

The semiconductor photoelectric devices 50a and 50b may be electrically connected to the first pixel circuit 110. The organic photoelectric device 100 may be electrically connected to the second pixel circuit 120 through a via electrode 90. The semiconductor photoelectric devices 50a and 50b and the organic photoelectric device 100 may be integrated for each pixel. For example, the semiconductor photoelectric devices 50a and 50b may be included in the blue pixel B and the red pixel R, respectively, and the organic photoelectric device 100 may be included in the green pixel G. The semiconductor photoelectric devices 50a and 50b and the organic photoelectric device 100 may sense light and sensed information may be transmitted to the first and second pixel circuits 110 and 120.

A metal wiring line 62 and a pad 64 may be formed on the semiconductor substrate 40. The metal wiring line 62 and the pad 64 may include a metal having a low resistivity to reduce signal delay, for example, aluminum (Al), copper (Cu), silver (Ag), or an alloy thereof, but is not limited thereto. In some embodiments, the metal wiring line 62 and the pad 64 may be located below the semiconductor photoelectric devices 50*a* and 50*b*.

A lower interlayer insulating layer 60, an upper interlayer insulating layer 80, and an isolation insulating layer 87 may be formed on the metal wiring line 62 and the pad 64. The lower interlayer insulating layer 60, the upper interlayer insulating layer 80, and the isolation insulating layer 87 may each be an inorganic insulating layer such as a silicon oxide layer and/or a silicon nitride layer or a low-K insulating layer such as a silicon carbide (SiC) layer, a hydrogenated silicon oxycarbide (SiCOH) layer, a silicon oxycarbide (SiCO) layer, or a fluorinated silicon oxide (SiOF) layer. A via hole 85 may be formed in the lower interlayer insulating layer 60 and the upper interlayer insulating layer 80, and a via electrode 90 may be formed in the via hole 85.

A color filter layer 70 may be formed on the lower interlayer insulating layer 60. The color filter layer 70 may include a blue filter 70B formed in the blue pixel B and a red filter 70R formed in the red pixel R. Although an example in which a green filter is not provided is described with respect to FIGS. 2 and 3, a green filter may be provided in some cases.

The upper interlayer insulating layer 80 and the isolation insulating layer 87 may be formed on the color filter layer 70. The organic photoelectric device 100 may be formed on the upper interlayer insulating layer 80. The organic photoelectric device 100 may include a pixel electrode PE including a plurality of first electrodes 102, a ridge (or other protruding) portion 104 protruding beyond the surfaces of the first electrodes 102 between the first electrodes 102, an organic photoelectric conversion layer 106 formed on the pixel electrode PE and the ridge portion 104, and an opposite electrode CE including a second electrode 108 on the organic photoelectric conversion layer 106.

In some embodiments, the pixel electrode PE and the opposite electrode CE may be transparent electrodes (or light-transmitting electrodes). The transparent electrode may include a conductive oxide such as indium tin oxide (ITO), indium zinc oxide (IZO), zinc oxide (ZnO), tin oxide (SnO), aluminum tin oxide (AlTO), or fluorine-doped tin oxide (FTO), or a metal thin film including a single layer having a small thickness or multiple layers.

A certain (e.g., predetermined) voltage may be applied to the opposite electrode CE through a wiring line. Thus, an electric field may be applied between the opposite electrode CE and the pixel electrode PE. The pixel electrode PE may be a charge collecting electrode for collecting charges generated in the organic photoelectric conversion layer 106.

The organic photoelectric conversion layer 106 may be configured to selectively absorb light in a green wavelength range and may replace (e.g., may be used instead of) a color filter of a green pixel. The organic photoelectric conversion layer 106 may generate charges from light due to the photoelectric effect and may include an organic material. The organic photoelectric conversion layer 106 may include a p-type layer in which main carriers are holes and an n-type layer in which main carriers are electrons.

In some embodiments, the p-type layer of the organic photoelectric conversion layer 106 may include a 3,4-ethylenedioxythiophene (EDOT) derivative. For example, hexa-3,4-ethylenedioxythiophene may be used as the EDOT derivative. The n-type layer of the organic photoelectric conversion layer 106 may include Alq3 or naphthalene-1,4,5,8-tetracarboxylic dianhydride (NTCDA). A cyanine-based coloring matter, squalium-based coloring matter, or the like may be used as the p-type layer, and fullerene (C60) or the like may be used as the n-type layer.

The organic photoelectric conversion layer 106 may generate charges in response to light in a certain wavelength band. In some embodiments, the organic photoelectric conversion layer 106 may generate charges in response to green light. In this case, light of other colors other than green may be transmitted to the color filter layer 70. When light is incident from the second electrode 108, light in a green wavelength range may be mainly absorbed by the organic photoelectric conversion layer 106 to be photoelectrically converted and light in the remaining wavelength range may pass through the first electrode 102 and be sensed by the semiconductor photoelectric devices 50*a* and 50*b*.

The ridge portion 104 may include the same material as the isolation insulating layer 87. The ridge portion 104 may have a form protruding from the isolation insulating layer 87. In the organic image sensor 10*a*, a contact area between an insulating region/layer including/forming the ridge portion 104 and the isolation insulating layer 87 and the organic photoelectric conversion layer 106 may increase. In other words, in the organic image sensor 10*a*, the adhesion between the insulating region/layer including/forming the ridge portion 104 and the isolation insulating layer 87 and the organic photoelectric conversion layer 106 may be improved.

Accordingly, a phenomenon (i.e., peeling phenomenon) that the organic photoelectric conversion layer 106 is peeled off at the interface between the pixel electrode PE and the organic photoelectric conversion layer 106 or the interface between the isolation insulating layer 87 and the organic photoelectric conversion layer 106 in the process of manufacturing the organic image sensor 10*a*, for example, in the process of removing a front polishing tape after back polishing for reducing the thickness of the semiconductor substrate 40 may be suppressed. The organic photoelectric device 100 including the ridge portion 104 will be described in more detail later herein.

An antireflection layer 92 and a condensing lens layer 96 may be further formed on the organic photoelectric device 100. The antireflection layer 92 may inhibit/prevent incident light 98 from being reflected. The condensing lens layer 96 may control the direction of the incident light 98 to collect light into one point. The cross-section of the condensing lens layer 96 may be cylindrical or hemispherical, but is not limited thereto.

The organic image sensor 10*a* may have a reduced size because the organic photoelectric device 100 has a stacked structure. Although a stacked structure of the organic photoelectric device 100 that selectively absorbs light (green light) in a green wavelength range has been described as an example with reference to FIGS. 2 and 3, the inventive concepts are not limited thereto.

In some embodiments, the organic image sensor 10*a* may have a structure in which an organic photoelectric device 100 selectively absorbing blue light is stacked and a semiconductor photoelectric device absorbing green light and a semiconductor photoelectric device absorbing red light are integrated in the semiconductor substrate 40. In some embodiments, the organic image sensor 10*a* may have a structure in which an organic photoelectric device 100 selectively absorbing red light is stacked and a semiconductor photoelectric device absorbing green light and a semiconductor photoelectric device absorbing blue light are integrated in the semiconductor substrate 40.

Figure 4:
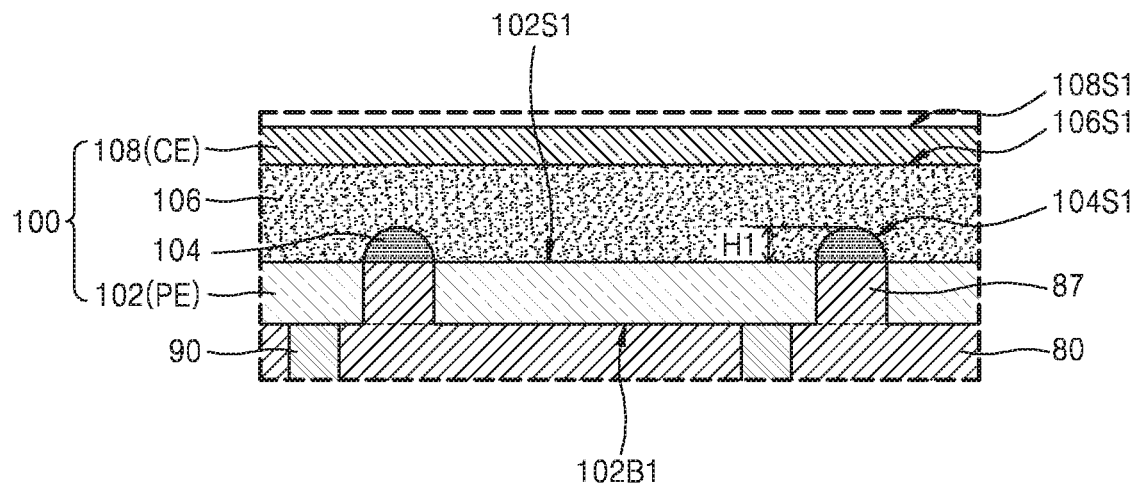
FIG. 4 is an enlarged view of a portion of an organic image sensor according to some embodiments of the inventive concepts.

FIG. 4 is an enlarged view of a portion of an organic image sensor according to some embodiments of the inventive concepts.

Specifically, FIG. 4 may be an enlarged view of a portion ELV of the organic image sensor 10a of FIG. 3. The organic image sensor 10a may include an organic photoelectric device 100, as described above. The organic photoelectric device 100 may include a pixel electrode PE including a plurality of first electrodes 102.

An isolation insulating layer 87 for insulating the first electrodes 102 may be formed between the first electrodes 102. An upper interlayer insulating layer 80 may be formed under the first electrodes 102 and the isolation insulating layer 87. Respective upper surfaces 102S1 of the first electrodes 102 may be coplanar with each other. The upper surfaces 102S1 of the first electrodes 102 may be flat surfaces. Lower surfaces 102B1 of the first electrodes 102 may be flat surfaces.

The organic photoelectric device 100 may include a ridge portion 104 protruding upwardly in the Z direction beyond the surfaces of the first electrodes 102 between the first electrodes 102. The ridge portion 104 may have a form protruding from the isolation insulating layer 87, as described above.

In the organic photoelectric device 100, a contact area between a surface 104S1 of the ridge portion 104 and an organic photoelectric conversion layer 106 may increase due to the ridge portion 104. In the organic photoelectric device 100, the adhesion between the organic photoelectric conversion layer 106 and an insulating region/layer including/forming the ridge portion 104 and the isolation insulating layer 87 may be improved.

Accordingly, a phenomenon (i.e., peeling phenomenon) that the organic photoelectric conversion layer 106 is peeled off at the interface between the pixel electrode PE and the organic photoelectric conversion layer 106 or the interface between the isolation insulating layer 87 and the organic photoelectric conversion layer 106 during the process of manufacturing the organic photoelectric device 100 may be suppressed. The ridge portion 104 may have various shapes. For example, the ridge portion 104 may have a hemispherical shape. The ridge portion 104 may have a height H1 and the height H1 may be adjusted according to the manufacturing process.

The organic photoelectric device 100 may include the organic photoelectric conversion layer 106 formed on the pixel electrode PE and the ridge portion 104. A surface 106S1 of the organic photoelectric conversion layer 106 may be planarized to be a flat surface. The organic photoelectric device 100 may include an opposite electrode CE including a second electrode 108 on an organic photoelectric conversion layer 106. The second electrode 108 constituting the opposite electrode CE may include a single layer. A surface 108S1 of the opposite electrode CE may be planarized to be a flat surface.

Figure 5:
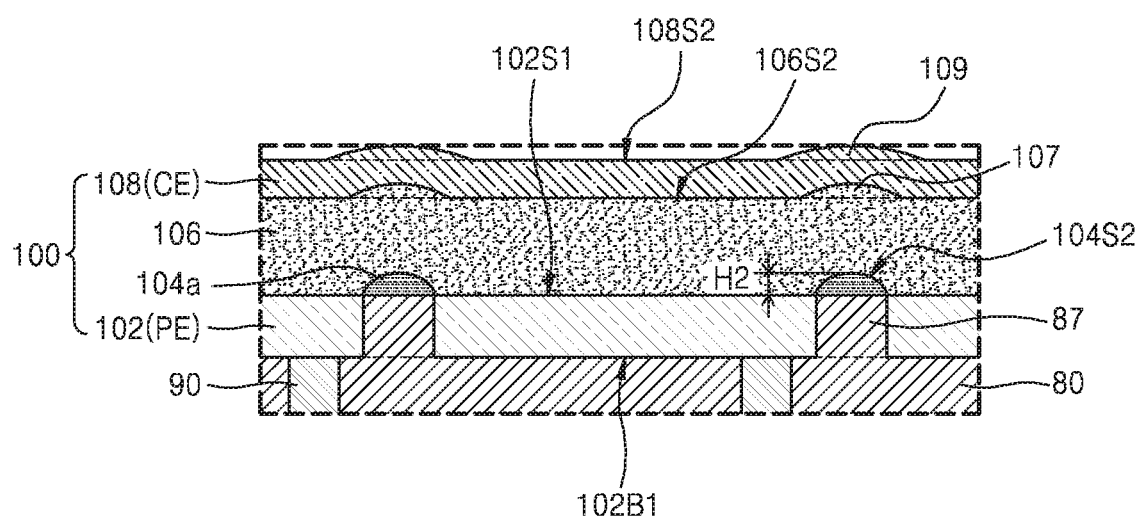
FIG. 5 is an enlarged view of a portion of an organic image sensor according to some embodiments of the inventive concepts.

FIG. 5 is an enlarged view of a portion of an organic image sensor according to some embodiments of the inventive concepts.

Specifically, FIG. 5 may be an enlarged view of the portion ELV of the organic image sensor 10a of FIG. 3. FIG. 5 may be the same as FIG. 4, except for a ridge portion 104a, an organic photoelectric conversion layer 106, and an opposite electrode CE, as compared to FIG. 4. In FIG. 5, the same reference numerals as those in FIG. 4 denote the same elements/members as those in FIG. 4, and the same description as that described with reference to FIG. 4 will be omitted or briefly described.

The organic photoelectric device 100 in FIG. 5 may include the ridge portion 104a. A surface 104S2 of the ridge portion 104a may contact the organic photoelectric conversion layer 106. A height H2 of the ridge portion 104a may be lower than that of the ridge portion 104 in FIG. 4. The curvature of the ridge portion 104a may be greater than that of the ridge portion 104 in FIG. 4.

A contact area between the surface 104S2 of the ridge portion 104a and the organic photoelectric conversion layer 106 may be adjusted by variously adjusting the height or the curvature of the ridge portion 104a, and thus, the adhesion between the organic photoelectric conversion layer 106 and the ridge portion 104a and between the organic photoelectric conversion layer 106 and an isolation insulating layer 87 may be adjusted. Accordingly, the organic photoelectric device 100 in FIG. 5 may suppress a phenomenon (i.e., peeling phenomenon) that the organic photoelectric conversion layer 106 is peeled off from a pixel electrode PE, the isolation insulating layer 87, and an upper interlayer insulating layer 80.

In the organic photoelectric device 100 of FIG. 5, a first convex (i.e., outwardly bulging) portion 107 protruding from a surface 106S2 of the organic photoelectric conversion layer 106 may be formed in a portion of the organic photoelectric conversion layer 106 corresponding to (e.g., overlapping/aligned with) the ridge portion 104a. A second convex portion 109 protruding from a surface 108S2 of the opposite electrode CE may be formed in a portion of the opposite electrode CE corresponding to (e.g., overlapping/aligned with) the ridge portion 104a and the first convex portion 107.

In the organic photoelectric device 100 of FIG. 5, a contact area between the organic photoelectric conversion layer 106 and the opposite electrode CE may increase due to the first convex portion 107 to thereby improve adhesion. Accordingly, a phenomenon (i.e., peeling phenomenon) that the organic photoelectric conversion layer 106 is peeled off at the interface between the organic photoelectric conversion layer 106 and the opposite electrode CE may be suppressed. In addition, in the organic photoelectric device 100 of FIG. 5, the adhesion between the opposite electrode CE and an antireflection layer (see the antireflection layer 92 in FIG. 3) may also be further improved due to the second convex portion 109.

Figure 6A:
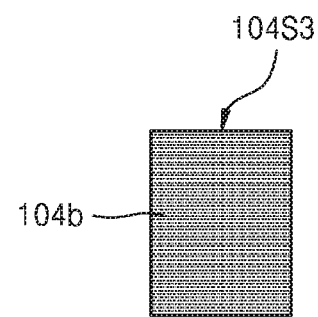
FIGS. 6A and 6B are views of cross-sectional shapes of ridge portions of an organic photoelectric device according to some embodiments of the inventive concepts.
Figure 6B:
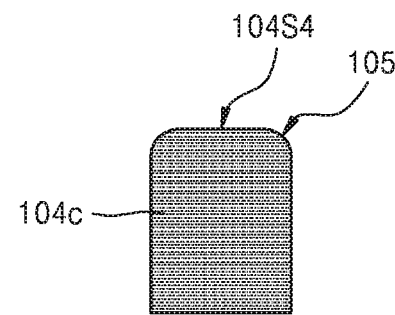

FIGS. 6A and 6B are views of cross-sectional shapes of ridge portions 104b and 104c of an organic photoelectric device according to some embodiments of the inventive concepts.

Specifically, the ridge portions 104b and 104c of FIGS. 6A and 6B may be employed in the organic photoelectric device 100 of FIGS. 4 and 5. The ridge portions 104b and 104c of FIGS. 6A and 6B may be replaced with the ridge portions 104 and 104a in the organic photoelectric device 100 of FIGS. 4 and 5.

The cross-section of the ridge portion 104b in FIG. 6A may have a rectangular shape. The cross-section of the ridge portion 104c in FIG. 6B may have a rectangular shape with a chamfer portion 105 formed at an edge. Surfaces 104S3 and 104S4 of the ridge portions 104b and 104c having rectangular shapes may contact the organic photoelectric conversion layer 106.

The ridge portions 104b and 104c of FIGS. 6A and 6B may increase a contact area with the organic photoelectric conversion layer 106. Accordingly, a phenomenon (i.e., peeling phenomenon) that the organic photoelectric conversion layer 106 is peeled off from the isolation insulating layer 87 or the upper interlayer insulating layer 80 of FIGS. 4 and 5 may be suppressed.

Figure 7A:
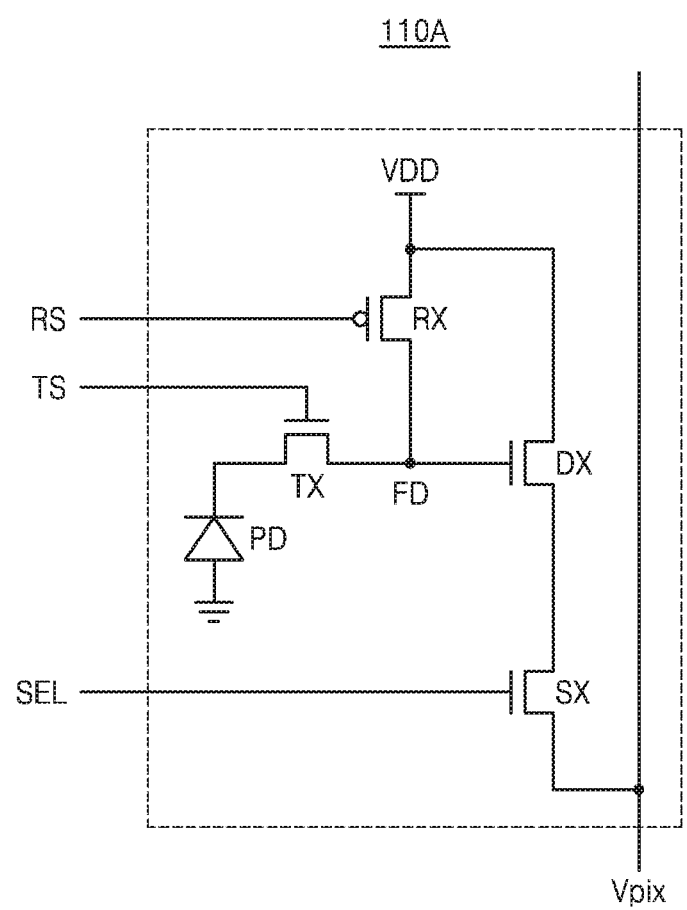
FIGS. 7A and 7B are circuit diagrams of a pixel circuit in an organic image sensor according to some embodiments of the inventive concepts.
Figure 7B:
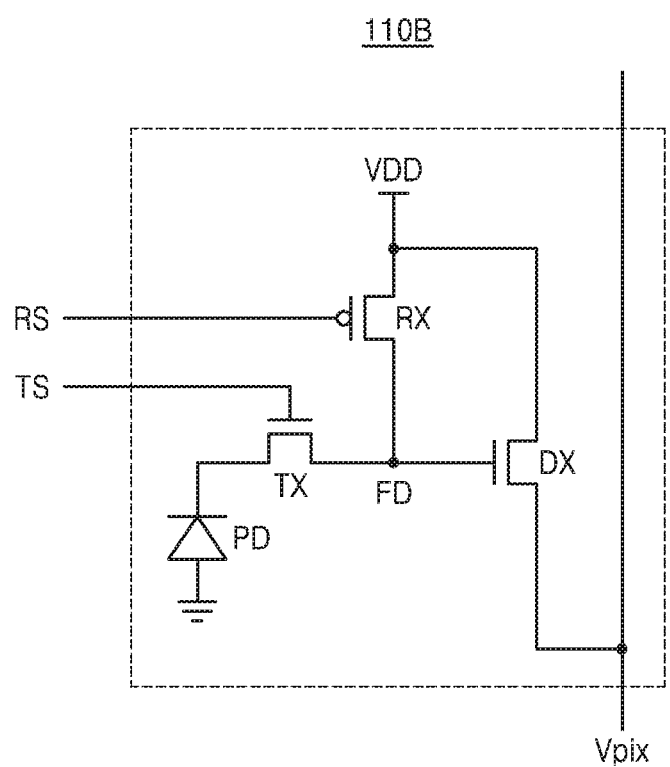

FIGS. 7A and 7B are circuit diagrams of a pixel circuit in an organic image sensor according to some embodiments of the inventive concepts.

Specifically, FIGS. 7A and 7B may be circuit diagrams of the first pixel circuit 110 connected to the semiconductor photoelectric devices 50a and 50b shown in FIG. 3. The first pixel circuit 110 may be included in one pixel (e.g., the pixel PX in FIG. 1). Examples of the first pixel circuit 110 of FIG. 3 may include first pixel circuits 110A and 110B of FIGS. 7A and 7B.

Referring to FIG. 7A, the first pixel circuit 110A in each pixel may include a plurality of transistors, i.e., a reset transistor RX, a drive transistor DX, a transfer transistor TX, and a selection transistor SX. The first pixel circuit 110A may be connected to a semiconductor photodiode PD implemented as the semiconductor photoelectric devices 50a and 50b described above.

Charges generated by the semiconductor photodiode PD may be transferred to a floating diffusion FD via a transfer transistor TX and the transferred charges may be accumulated in the floating diffusion FD. The transfer transistor TX may operate in response to a transfer control signal TS transmitted to a gate electrode of the transfer transistor TX.

The drive transistor DX may operate as a source follower buffer amplifier by charges accumulated in the floating diffusion FD. The drive transistor DX may amplify the charges accumulated in the floating diffusion FD and transfer the amplified charges to the selection transistor SX.

The selection transistor SX may operate in response to a selection control signal SEL for selecting a certain pixel (e.g., the pixel PX in FIG. 1) in a pixel array (e.g., the pixel array 11 in FIG. 1) and may perform switching and addressing operations. When the selection control signal SEL is input from a row driver (e.g., the row driver 12 in FIG. 1), the selection transistor SX may output an electrical signal Vpix to a column line connected to the pixel PX.

The reset transistor RX may operate in response to a reset control signal RS transmitted from a row driver (e.g., the row driver 12 in FIG. 1). When the reset control signal RS is received, the reset transistor RX may reset the voltage of the floating diffusion FD to the power supply voltage VDD.

Referring to FIG. 7B, the first pixel circuit 110B according to some embodiments may be different from that of FIG. 7A and may include three transistors, i.e., a reset transistor RX, a drive transistor DX, and a transfer transistor TX. That is, the first pixel circuit 110B may include only three transistors, i.e., the reset transistor RX, the drive transistor DX, and the transfer transistor TX, unlike the first pixel circuit 110A according to the example shown in FIG. 7A. The reset transistor RX may reset the voltage of the floating diffusion FD to the power supply voltage VDD in response to a reset control signal RS transmitted from a row driver (e.g., the row driver 12 in FIG. 1) or set the voltage of the floating diffusion FD to a low level, for example, a voltage of 0 volt, to perform a function similar to that of the selection transistor SX shown in FIG. 7A.

Figure 8A:
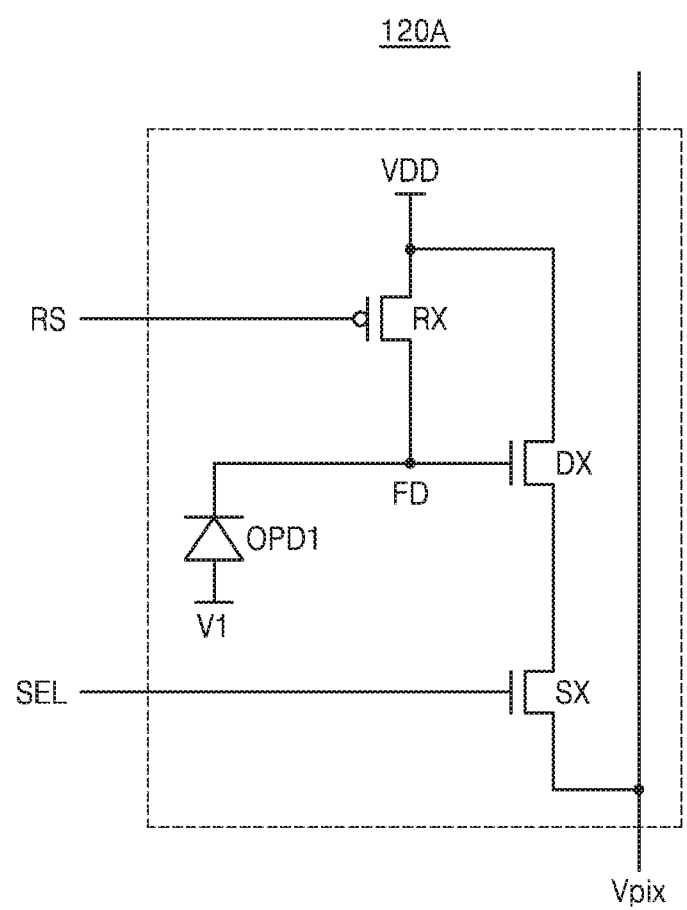
FIGS. 8A to 8C are circuit diagrams of a pixel circuit in an organic image sensor according to some embodiments of the inventive concepts.
Figure 8B:
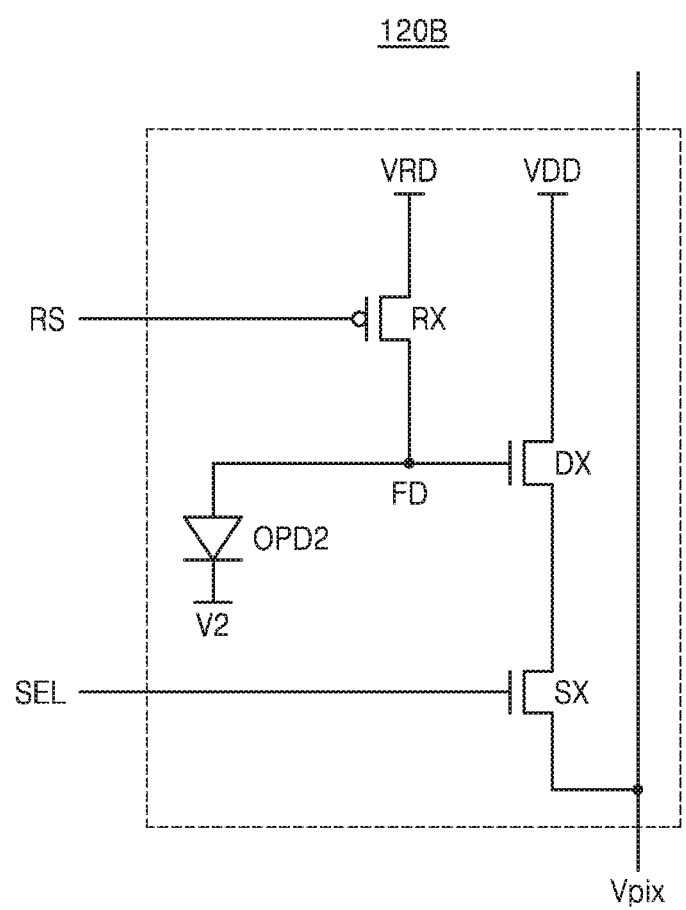
Figure 8C:
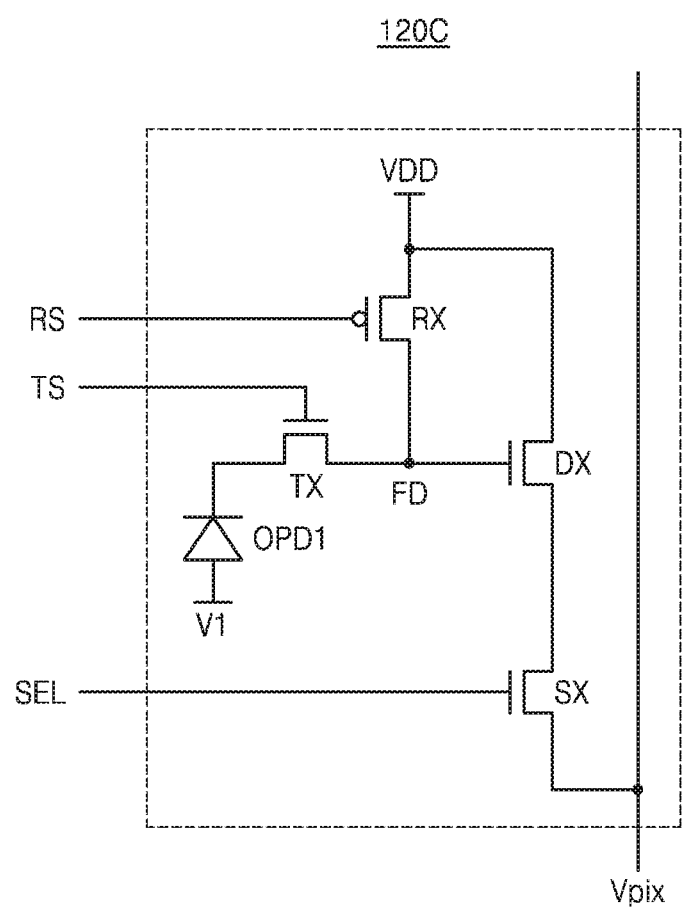

FIGS. 8A to 8C are circuit diagrams of a pixel circuit in an organic image sensor according to some embodiments of the inventive concepts.

Specifically, FIGS. 8A to 8C may be circuit diagrams of the second pixel circuit 120 connected to the organic photoelectric device 100 shown in FIG. 3. The second pixel circuit 120 may be included in one pixel (e.g., the pixel PX in FIG. 1). Examples of the second pixel circuit 120 of FIG. 3 may include second pixel circuits 120A, 120B, and 120C of FIGS. 8A to 8C.

Referring to FIG. 8A, the second pixel circuit 120A may include a drive transistor DX, a reset transistor RX, and a selection transistor SX. A gate terminal of the drive transistor DX may be connected to a floating diffusion FD, and the floating diffusion FD may accumulate charges generated by the organic photoelectric device 100 described above. In some embodiments, the organic photoelectric device 100 may be an organic photodiode OPD1 including an organic material.

The operation of the second pixel circuit 120A shown in FIG. 8A may be similar to that of the first pixel circuit 110A shown in FIG. 7. In FIG. 8A, the organic photodiode OPD1 may include electrons as main carriers. When electrons are used as the main carriers, a cathode of the organic photodiode OPD1 may be connected to the ground voltage or a first reference voltage V1 having a negative voltage of about −0.3 volts to about −0.5 volts.

Referring to FIG. 8B, the second pixel circuit 120B may include a drive transistor DX, a reset transistor RX, and a selection transistor SX. An organic photodiode OPD2 in the second pixel circuit 120B shown in FIG. 8B may use holes as main carriers. When holes are used as the main carriers, the organic photodiode OPD2 may be connected to a floating diffusion FD in a direction opposite to that of FIG. 8A. That is, a cathode of the organic photodiode OPD2 may be connected to the floating diffusion FD, and an anode of the organic photodiode OPD2 may be connected to a second reference voltage V2.

In some embodiments, the second reference voltage V2 may have a voltage of a few volts, e.g., about 3.5 volts. A drain terminal of the reset transistor RX may be connected to a voltage other than the power supply voltage VDD, for example, a read voltage VRD, due to the organic photodiode OPD2 having holes as main carriers.

Referring to FIG. 8C, the second pixel circuit 120C may include a drive transistor DX, a reset transistor RX, a selection transistor SX, and a transfer transistor TX. That is, the second pixel circuit 120C shown in FIG. 8C may be similar to the first pixel circuit 110A shown in FIG. 7A. In FIG. 8C, an organic photodiode OPD1 may be replaced by an organic photoelectric device such as the organic photodiode OPD2 using holes as the main carriers.

Figure 9:
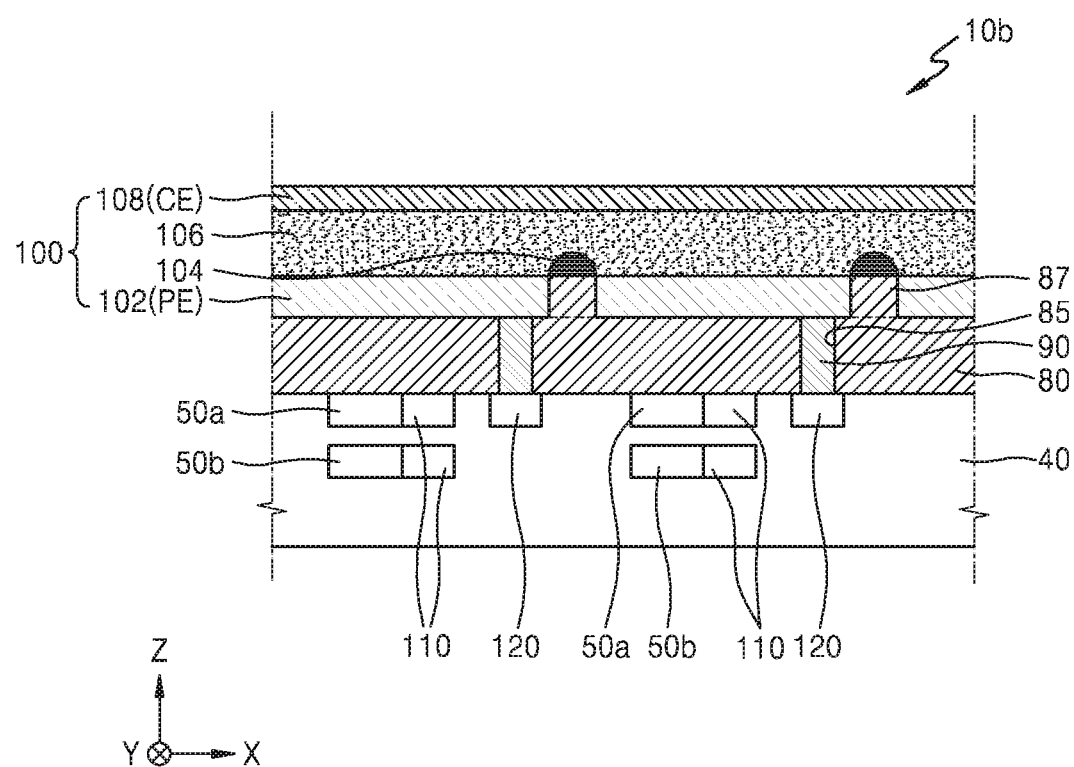
FIG. 9 is a cross-sectional view of a portion of an organic image sensor according to some embodiments of the inventive concepts.

FIG. 9 is a cross-sectional view of a portion of an organic image sensor 10b according to some embodiments of the inventive concepts.

Referring to FIG. 9, the organic image sensor 10b may be the same as the organic image sensor 10a of FIG. 3, except that a color filter layer is not formed (i.e., is omitted) and semiconductor photoelectric devices 50a and 50b are stacked, as compared with the organic image sensor 10a of FIG. 3. In FIG. 9, the same reference numerals as those in FIG. 3 denote the same elements/members as those in FIG. 3, and the same description as that described with reference to FIG. 3 will be omitted or briefly described.

In the organic image sensor 10b, the semiconductor photoelectric devices 50a and 50b are stacked in the vertical direction (i.e., Z direction) and the color filter layer is not formed, as compared with the organic image sensor 10a of FIG. 3. The semiconductor photoelectric devices 50a and 50b are electrically connected to a first pixel circuit 110. The semiconductor photoelectric devices 50a and 50b may selectively absorb light (blue light) in a blue wavelength range and light (red light) in a red wavelength range, respectively.

An organic photoelectric device 100 is stacked on the semiconductor photoelectric devices 50a and 50b. The organic photoelectric device 100 has been described above and thus a repeated description of the organic photoelectric device 100 is omitted. An antireflection layer and a condensing lens layer may be further formed on the organic photoelectric device 100.

The organic image sensor 10b has a structure in which the semiconductor photoelectric device 50a, which is a blue semiconductor photoelectric device, and the semiconductor photoelectric device 50b, which is a red semiconductor photoelectric device, are stacked under the organic photoelectric device 100 selectively absorbing light in a green wavelength range, and thus, the size of the organic image sensor 10b may be further reduced to thereby realize a miniaturized image sensor.

A structure in which the organic photoelectric device 100 for selectively absorbing light in a green wavelength range is stacked has been described as an example with reference to FIG. 9. However, the inventive concepts are not limited thereto, and the organic image sensor 10b may have a structure in which an organic photoelectric device selectively absorbing light in a blue wavelength range is stacked and a semiconductor photoelectric device absorbing green light and a semiconductor photoelectric device absorbing red light are integrated in a semiconductor substrate 40. In some embodiments, the organic image sensor 10b may have a structure in which an organic photoelectric device selectively absorbing light in a red wavelength range is stacked and a semiconductor photoelectric device absorbing green light and a semiconductor photoelectric device absorbing blue light are integrated in the semiconductor substrate 40.

FIGS. 10A to 10F are cross-sectional views illustrating a method of manufacturing an organic photoelectric device according to some embodiments of the inventive concepts.

Figure 10A:
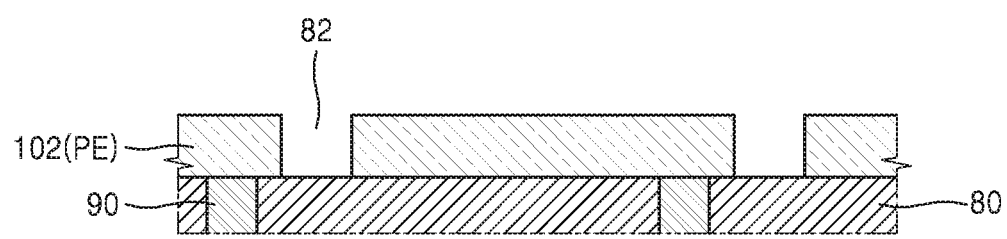
FIGS. 10A to 10F are cross-sectional views illustrating a method of manufacturing an organic photoelectric device according to some embodiments of the inventive concepts.

Referring to FIG. 10A, a plurality of via electrodes 90 are formed in an upper interlayer insulating layer 80 on a semiconductor substrate. A pixel electrode PE including first electrodes 102 spaced apart from each other is formed on the via electrodes 90. The first electrode 102 may be formed by forming a conductive film on the upper interlayer insulating layer 80 and then patterning the conductive film.

The via electrodes 90 may be electrically connected to the first electrode 102. A hole 82 may be formed to expose a portion of the upper interlayer insulating layer 80 via the pixel electrode PE. The pixel electrode PE may be a component of the organic photoelectric device.

Figure 10B:
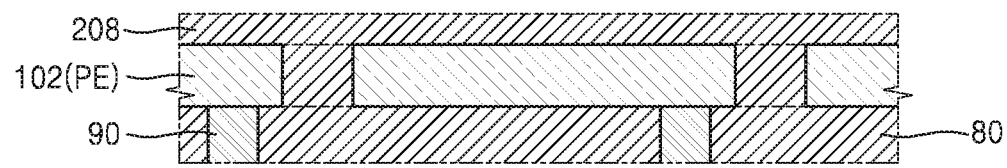

Referring to FIG. 10B, a first insulating layer 208 is formed on the pixel electrode PE and the upper interlayer insulating layer 80 in (e.g., to fill) the hole 82, and then planarized. Accordingly, an isolation insulating layer 87 that isolates (physically and electrically) the first electrodes 102 from each other may be formed between the first electrodes 102.

Figure 10C:
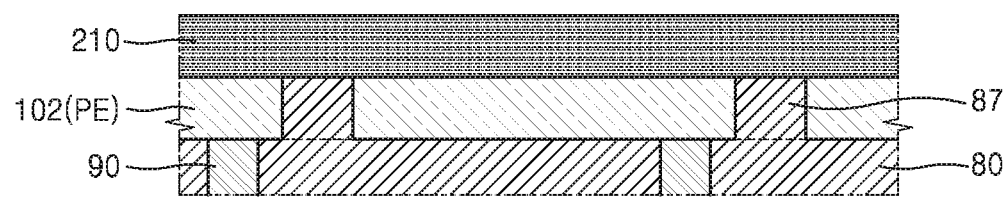
Figure 10D:
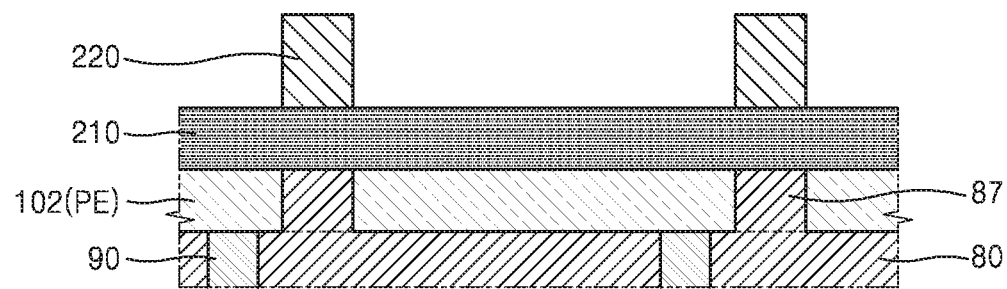

Referring to FIGS. 10C and 10D, a second insulating layer 210 is formed on the pixel electrode PE and the isolation insulating layer 87, as shown in FIG. 10C. Next, as shown in FIG. 10D, a photoresist pattern 220 is formed on the second insulating layer 210. The photoresist pattern 220 is formed over the isolation insulating layer 87.

Figure 10E:
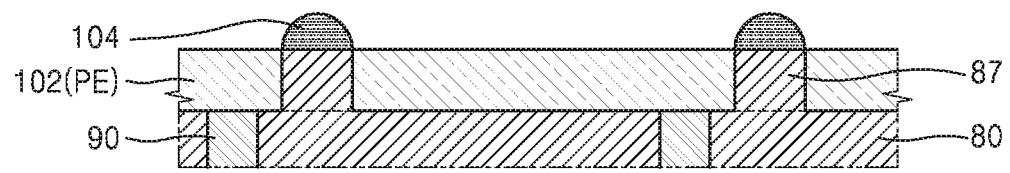

Referring to FIG. 10E, after the second insulating layer 210 is etched using the photoresist pattern 220 (see FIG. 10D) as a mask, the photoresist pattern 220 is stripped and removed. In this way, a ridge portion 104 may be formed on the isolation insulating layer 87. The ridge portion 104 may be a component of the organic photoelectric device. The shape of the ridge portion 104 may be determined according to the degree of etching of the second insulating layer 210 when the photoresist pattern 220 is stripped.

Figure 10F:
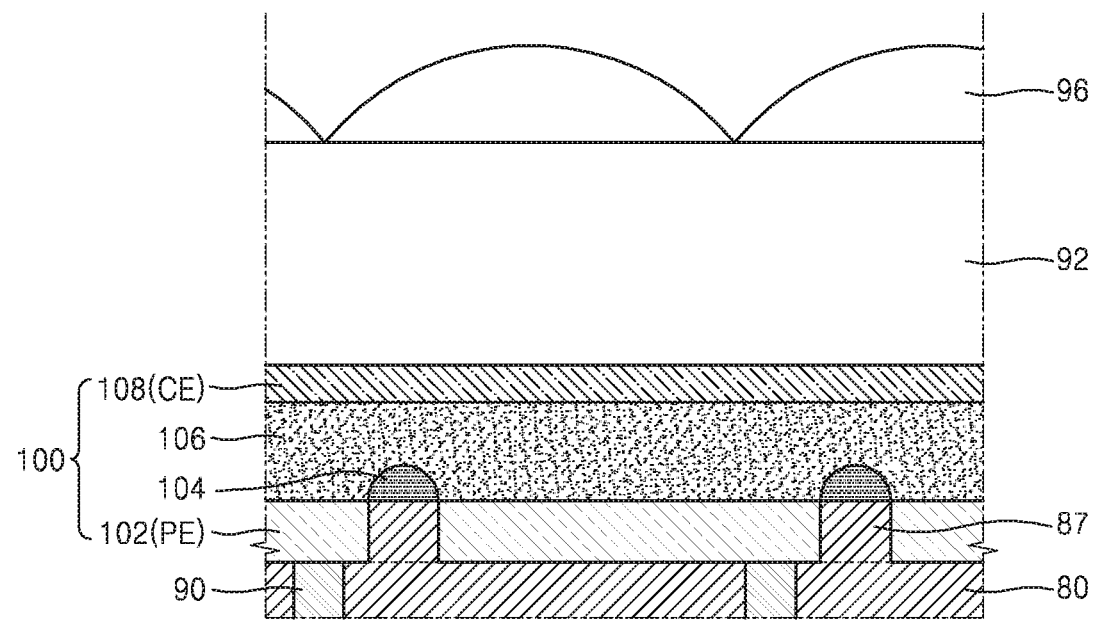

Referring to FIG. 10F, an organic photoelectric conversion layer 106 is formed on the ridge portion 104 and the pixel electrode PE. A contact area between the organic photoelectric conversion layer 106 and an insulating region/layer including the ridge portion 104 and the isolation insulating layer 87 may increase due to the ridge portion 104. Next, an opposite electrode CE including a second electrode 108 is formed on the organic photoelectric conversion layer 106 to form an organic photoelectric device 100. Then, an antireflection layer 92 and a condensing lens layer 96 may be formed on the organic photoelectric device 100.

Figure 11:
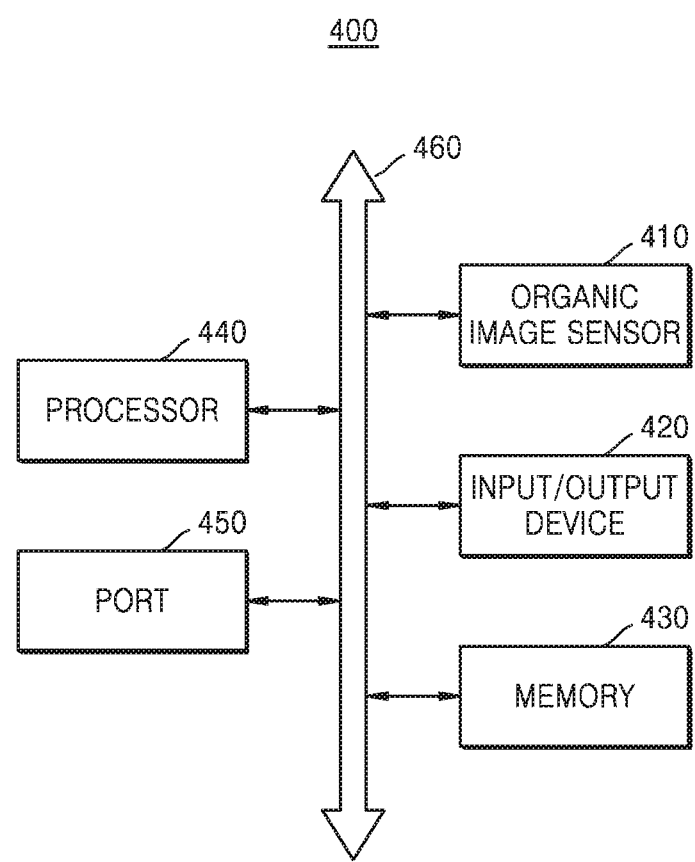
FIG. 11 is a block diagram of an electronic apparatus to which an organic image sensor according to some embodiments of the inventive concepts may be applied.

FIG. 11 is a block diagram of an electronic apparatus to which an organic image sensor 410 according to some embodiments of the inventive concepts may be applied.

Referring to FIG. 11, the organic image sensor 410 according to some embodiments of the inventive concepts may be applied to a computer device 400. The computer device 400 may include an input/output device 420, a memory 430, a processor 440, and a port 450 in addition to the organic image sensor 410. In addition, the computer device 400 may further include a wired/wireless communication device, a power supply device, and the like. The port 450 may be a device through which the computer device 400 communicates with a video card, a sound card, a memory card, a USB device, and the like. Examples of the computer device 400 may include a smart phone, a tablet computer (e.g., a tablet personal computer (PC)), and a smart wearable device in addition to a general desktop computer and a laptop computer.

The processor 440 may perform particular operations, commands, tasks, and so on. The processor 440 may be a central processing unit (CPU) or a microcontroller unit (MCU) and may communicate, via a bus 460, with the memory 430, the input/output device 420, the organic image sensor 410, and other devices connected to the port 450.

The memory 430 may be a storage medium for storing data necessary for the operation of the computer device 400, or multimedia data. The memory 430 may include a volatile memory such as random access memory (RAM), or a non-volatile memory such as a flash memory. The memory 430 may also include at least one of a solid state drive (SSD), a hard disk drive (HDD), and an optical drive (ODD) as a storage device.

The input/output device 420 may include an input device such as a keyboard, a mouse, and a touch screen, provided to users, and an output device such as a display and an audio output unit. The organic image sensor 410 may be coupled to the processor 440 via a bus 460 or another communication unit. The processor 440 may perform the function of the image processor 20 of FIG. 1. The organic image sensor 410 may be one of the organic image sensors 10a or 10b described above.

Although the inventive concepts have been particularly shown and described with reference to example embodiments thereof, it will be understood that various changes in form and details may be made therein without departing from the scope of the following claims.

What is claimed is:

1. An organic image sensor comprising:
    a pixel electrode comprising a plurality of first electrodes spaced apart from each other;
    an insulating region comprising a protruding portion that protrudes beyond surfaces of the plurality of first electrodes, wherein the insulating region further comprises an isolation insulating layer that is between the plurality of first electrodes to isolate the plurality of first electrodes from each other, wherein the protruding portion of the insulating region is on the isolation insulating layer and does not overlap the plurality of first electrodes, and wherein a curved surface of the protruding portion overlaps the isolation insulating layer;

an organic photoelectric conversion layer on the pixel electrode and the protruding portion of the insulating region; and a second electrode opposite the pixel electrode and on the organic photoelectric conversion layer.

2. The organic image sensor of claim 1, further comprising an interlayer insulating layer that is under the pixel electrode and the isolation insulating layer.

3. The organic image sensor of claim 1, wherein the surfaces comprise respective upper surfaces of the plurality of first electrodes that are coplanar with each other.

4. The organic image sensor of claim 1, wherein the second electrode comprises a single layer.

5. The organic image sensor of claim 1, further comprising an antireflection layer and a condensing lens layer that are on the second electrode.

6. The organic image sensor of claim 1, wherein the organic photoelectric conversion layer comprises a first convex portion protruding from a surface of the organic photoelectric conversion layer and overlapping the protruding portion of the insulating region.

7. The organic image sensor of claim 6, further comprising an antireflection layer on the second electrode, wherein the second electrode comprises a second convex portion protruding from a surface of the second electrode and overlapping the protruding portion of the insulating region and the first convex portion, and wherein the second convex portion contacts the antireflection layer.

8. An organic image sensor comprising:
a semiconductor substrate;
a pixel circuit on the semiconductor substrate;
an interlayer insulating layer on the pixel circuit;
an organic photoelectric device comprising:
    a pixel electrode comprising a plurality of first electrodes spaced apart from each other and insulated from each other by an isolation insulating layer on the interlayer insulating layer;
    a ridge portion protruding from a surface of the isolation insulating layer that is between the plurality of first electrodes;
    an organic photoelectric conversion layer on the pixel electrode and the ridge portion; and
    a second electrode opposite the pixel electrode and on the organic photoelectric conversion layer,
    wherein a first thickness, in a direction perpendicular to the semiconductor substrate, of the ridge portion across a center point thereof is less than a second thickness, in the direction, of a portion of the organic photoelectric conversion layer that is between the isolation insulating layer and the second electrode; and
a via electrode in the interlayer insulating layer and electrically connecting the pixel circuit to the pixel electrode.

9. The organic image sensor of claim 8,
wherein respective upper surfaces of the plurality of first electrodes are coplanar with each other, and wherein the ridge portion protrudes upwardly beyond the respective upper surfaces of the plurality of first electrodes.

10. The organic image sensor of claim 8, wherein upper and lower surfaces of the plurality of first electrodes are flat surfaces.

11. The organic image sensor of claim 8, wherein a cross-section of the ridge portion comprises a hemispherical shape, and wherein the hemispherical shape does not overlap any of the plurality of first electrodes in the direction.

12. The organic image sensor of claim 8, wherein a third thickness of the isolation insulating layer in the direction is greater than the first thickness.

13. An organic image sensor comprising:
a semiconductor substrate;
a semiconductor photoelectric device on the semiconductor substrate;
a first pixel circuit electrically connected to the semiconductor photoelectric device on the semiconductor substrate;
an organic photoelectric device stacked on the semiconductor photoelectric device and comprising an organic photoelectric conversion layer; and
a second pixel circuit electrically connected to the organic photoelectric device on the semiconductor substrate,
wherein the organic photoelectric device comprises:
    a pixel electrode comprising a plurality of first electrodes;
    an insulating region comprising a first portion that is between the plurality of first electrodes and a protruding second portion that protrudes upwardly beyond respective upper surfaces of the plurality of first electrodes, wherein the organic photoelectric conversion layer is on the pixel electrode and the protruding second portion of the insulating region, and wherein a width of the first portion of the insulating region in a direction parallel to the semiconductor substrate is greater than or equal to a width of the protruding second portion of the insulating region in the direction; and
    a second electrode opposite the pixel electrode and on the organic photoelectric conversion layer.

14. The organic image sensor of claim 13, further comprising a color filter layer that is on the semiconductor photoelectric device,
wherein the organic photoelectric device is on the color filter layer.

15. The organic image sensor of claim 14,
wherein the color filter layer comprises a red or blue color filter layer,
wherein the semiconductor photoelectric device comprises one among a plurality of semiconductor photoelectric devices comprising a red semiconductor photoelectric device and a blue semiconductor photoelectric device, and
wherein the organic photoelectric conversion layer is configured to absorb green light.

16. The organic image sensor of claim 13, further comprising an interlayer insulating layer that is on the semiconductor photoelectric device and the first and second pixel circuits,
wherein the first portion of the insulating region is on the interlayer insulating layer,
wherein the protruding second portion of the insulating region protrudes from the first portion of the insulating region, and wherein the protruding second portion of the insulating region does not overlap any of the plurality of first electrodes.

17. The organic image sensor of claim 13,
wherein the semiconductor photoelectric device comprises one among a plurality of semiconductor photoelectric devices comprising a red semiconductor photoelectric device and a blue semiconductor photoelectric device stacked on the semiconductor substrate, and
wherein the organic photoelectric conversion layer is configured to absorb green light.

18. The organic image sensor of claim 13,
wherein the respective upper surfaces of the plurality of first electrodes are coplanar with each other, and
wherein the organic photoelectric conversion layer and the second electrode comprise respective convex portions that overlap the protruding second portion of the insulating region.

19. The organic image sensor of claim 13, further comprising a via electrode,
wherein the plurality of first electrodes of the organic photoelectric device are connected to the second pixel circuit via the via electrode.

* * * * *